United States Patent
Gunning et al.

(10) Patent No.: US 6,208,672 B1
(45) Date of Patent: *Mar. 27, 2001

(54) OPTICAL PULSE SOURCE

(75) Inventors: Paul Gunning, Great Bealings; Kevin Smith, Ipswich; Davey Russell, Ipswich; Julian Kazimierz Lucek, Ipswich; David Graham Moodie, Ipswich; Derek Nesset, Ipswich, all of (GB)

(73) Assignee: British Telecommunications public limited company, London (GB)

(*) Notice: Subject to any disclaimer, the term of this patent is extended or adjusted under 35 U.S.C. 154(b) by 0 days.

This patent is subject to a terminal disclaimer.

(21) Appl. No.: 09/043,480

(22) PCT Filed: Feb. 7, 1997

(86) PCT No.: PCT/GB97/00379

§ 371 Date: Mar. 23, 1998

§ 102(e) Date: Mar. 23, 1998

(87) PCT Pub. No.: WO97/30527

PCT Pub. Date: Aug. 21, 1997

Related U.S. Application Data (63) Continuation-in-part of application No. 08/648,611, filed on May 10, 1996, now Pat. No. 5,778,015.

(30) Foreign Application Priority Data

Feb. 16, 1996 (EP) .................................................. 96301079
Feb. 16, 1996 (GB) .................................................. 9603265
Jun. 26, 1996 (EP) .................................................. 96304694
Jun. 26, 1996 (GB) .................................................. 9613345

(51) Int. Cl.$^7$ .................................................. H01S 3/115
(52) U.S. Cl. .................................................. 372/12; 372/25
(58) Field of Search .................................................. 372/25, 26, 27, 372/96; 359/136, 189

(56) References Cited

U.S. PATENT DOCUMENTS

| | | | |
|---|---|---|---|
| 5,519,526 | * 5/1996 | Chua | 359/152 |
| 5,739,933 | * 4/1998 | Dembeck | 359/117 |
| 5,778,015 | * 7/1998 | Gunning | 372/25 |
| 5,784,185 | * 7/1998 | Smith | 359/163 |
| 5,953,138 | * 9/1999 | Ellis | 359/123 |

OTHER PUBLICATIONS

Electronics Letters, vol. 31, No. 20, Sep. 28, 1995, pp. 1767–1769, Guy et al, "Low Repetition Rate Master Source for Optical Processing in Ultrahigh–Speed OTDM Networks".

IEICE Transactions on Electronics, vol. E78–C, No. 1, Jan. 1, 1995, pp. 50–54, wakita et al, "Short Optical Pulse Generation and Modulation by a Multi–Section MQW Modulator/DFB Laser Integrated Light Source".

Proceedings of the International Semiconductor Laser Conference, Maui, Hawaii, Sep. 19–23, 1994, Institute of Electrical and Electronics Engineers, p. 43/44, Raybon et al, "Digitally Encoded Optical Pulse Generation from an Integrated DBR Laser–Modulator".

Electronics Letters, vol. 32, No. 1, Jan. 4, 1996, p. 44/45, Seo et al, "Timing Jitter Reduction of Gain–Switched DFB Laser by External Injection–Seeding".

* cited by examiner

Primary Examiner—Teresa M. Arroyo
Assistant Examiner—Gioacchino Inzirillo
(74) Attorney, Agent, or Firm—Nixon & Vanderhye P.C.

(57) ABSTRACT

An optical pulse source includes a gain-switched semiconductor laser diode. Light from a continuous wave source is opitically coupled into the laser cavity. Light output from the laser cavity passes through an electro-optic amplitude modulator. Synchronized modulating signals are applied to the semiconductor diode and to the amplitude modulator. The source outputs short low-jitter low-pedestal optical pulses and is suitable for use, for example, in a broadband optical network operating at thigh bit rates of 100 Gbit/s or more, or in an optical interconnect.

17 Claims, 8 Drawing Sheets

OPTICAL PULSE SOURCE

RELATED APPLICATION

This is a continuation-in-part of our commonly assigned U.S. application Ser. No. 08/648,611 filed May 10, 1996 and now issued on Jul. 7, 1998 as U.S. Pat. No. 5,778,015.

BACKGROUND OF THE INVENTION

1. Field of the Invention

The present invention relates to an optical pulse source. Such a source might be used, for example, in a transmitter for a broadband optical network or in an optical interconnect.

2. Related Art

Broadband optical networks are expected to operate at data transmission rates of 100 Gbit/s and beyond. Operation at such rates places heavy demands on the optical sources used. The repetition rate required of the pulse source may be less than the full bit rate, since the datastream at the full bit rate will typically be generated by multiplexing the optical source in the time domain. However, for this to be possible, the pulses output by the source need to be of short duration and desirably should have low temporal jitter.

SUMMARY OF THE INVENTION

According to a first aspect of the present invention there is provided an optical pulse source comprising:

a) a gain-switched semiconductor laser diode;

b) a continuous wave light source which is coupled to the optical cavity of the semiconductor laser diode;

c) an electro-optic amplitude modulator which is connected to the optical output of the semiconductor laser diode; and d) control inputs, located respectively on the semiconductor laser diode and on the electro-optic modulator, for applying synchronised modulating signals to the semiconductor laser diode and to the electro-optic modulator.

The present invention uses in combination a laser diode, injection of a cw beam into the laser diode cavity, and gating of the laser diode output using a synchronously driven amplitude modulator. The present inventors have found that this combination provides a pulse source markedly superior to sources known hitherto. A source embodying the present invention has produced pulses of 4 ps duration with temporal jitter of only 0.6 ps. Such pulses are suitable for use at bit rates as high as 100 Gbit/s. By contrast, previously proposed directly modulated sources have not been capable of operation beyond 40 Gbit/s. Examples of such prior art systems include that disclosed in the paper by M J Guy et al "Low Repetition Rate Master Source for Optical Processing in Ultra High-Speed OTDM Networks" ELECTRONICS LETTERS, Sept. 28, 1995, Vol 31, Number 20 pp 1767–1768. This discloses a system using a DFB (distributed feedback) SLD and a synchronously driven electro-absorption modulator connected to the output of the laser. This system improves the pulse shape by reducing the pulse pedestal, but suffers from performance limitations associated with the interaction between the modulator and the jitter in the pulses from the semiconductor laser diode.

It has also been proposed previously to use injection of a cw beam into a directly modulated laser diode. An example of a source using cw injection is disclosed in "A High Speed Broadcast and Select TDMA Network Using Optical Demultiplexing", L P Barry et al, Proceedings 21st European Conference on Optical Communications, ECOC '95 pp 1437–440. Injection of cw light tends to increase the pulse pedestal and so although the temporal jitter is reduced, the overall suitability of the pulse for use at high bit rates remains limited. The present inventors have found however that when cw injection and amplitude gating are used in combination, there is a mutual interaction between their modes of operation, so that the quality of the output pulse is markedly superior to that produced when either of these two techniques is used in isolation. The use of cw injection reduces the jitter in the signal input to the amplitude modulator and this eliminates many of the dispersion-related effects otherwise associated with the use of such a modulator. At the same time, the modulator largely eliminates the pedestal which would otherwise be present in the output pulse when cw injection is used.

Another advantage of the present invention is that the use of cw injection reduces the bias voltage required by the laser. This makes the source particularly suitable for use, for example, in the laser array of an optical interconnect such as that disclosed in U.S. Pat. No. 5,363,961 (Hamanaka). In such an array it is advantageous to reduce or eliminate the need for bias voltage, so as to reduce the overall power dissipation.

The semiconductor laser diode may be a distributed feedback semi-conductor laser diode (DFB-SLD) in which case preferably it has a buried heterojunction structure. Alternatively a ridge waveguide DFB-SLD might be used. The present invention is not however limited to the use of DFB lasers, and may also be implemented using, for example, Fabry-Perot Lasers (FPL), Vertical Cavity Surface Emitting Lasers, or Distributed Bragg Reflector Lasers. For some fields of use, the Fabry-Perot laser is particularly to be preferred. An FPL is capable of emitting at several discrete wavelengths. Conventionally, an external diffraction grating, which may be bulk optic or fibre-based, is used to select one of several possible wavelengths corresponding to different longitudinal modes of the laser. In systems embodying the present invention, the cw beam can be used in place of an external filter to select a given mode. The system then provides a pulse source tunable to different discrete wavelengths. Such a source is particularly suitable for systems using WDM (wavelength division multiplexing).

Preferably the electro-optic modulator is an electro-absorption modulator.

Electro-absorption modulators exhibit strongly non-linear variation of device optical absorption characteristics under an applied reversed bias voltage. This makes them particularly suitable for use as the synchronously driven amplitude modulator in a system embodying the present invention.

Preferably the pulse source further comprises optical pulse shaping means connected on the output side of the modulator. The pulse shaping means may comprise a length of normally dispersive fibre.

The shape of the pulses output from the source can be further enhanced using, for example, a length of normally dispersive fibre. Alternatively other pulse shaping means may be used. In particular, it may be advantageous to use a chirped grating in place of normally dispersive fibre. A suitable grating is disclosed, for example, in the paper by P. Gunning et al. at pp 1066–1067, ELECTRONICS LETTERS, Jun. 22, 1995, Vol. 31, No. 13.

According to a second aspect of the present invention, there is provided a method of generating optical pulses comprising:

a) applying a first electrical modulating signal to a gate input of a gain-switched semiconductor laser diode;

b) coupling continuous wave light into an optical cavity of the semiconductor laser diode;

c) applying a second modulating signal, which is synchronised to the first electrical modulating signal, to a control input of an electro-optic amplitude modulator; and d) passing pulses output from the semiconductor laser diode through the electro-optic amplitude modulator.

BRIEF DESCRIPTION OF THE DRAWINGS

A method and apparatus embodying the present invention will now be described in further detail, by way of example only, with reference to the accompanying drawings in which.

DETAILED DESCRIPTION OF EXEMPLARY EMBODIMENTS

Figure 1:
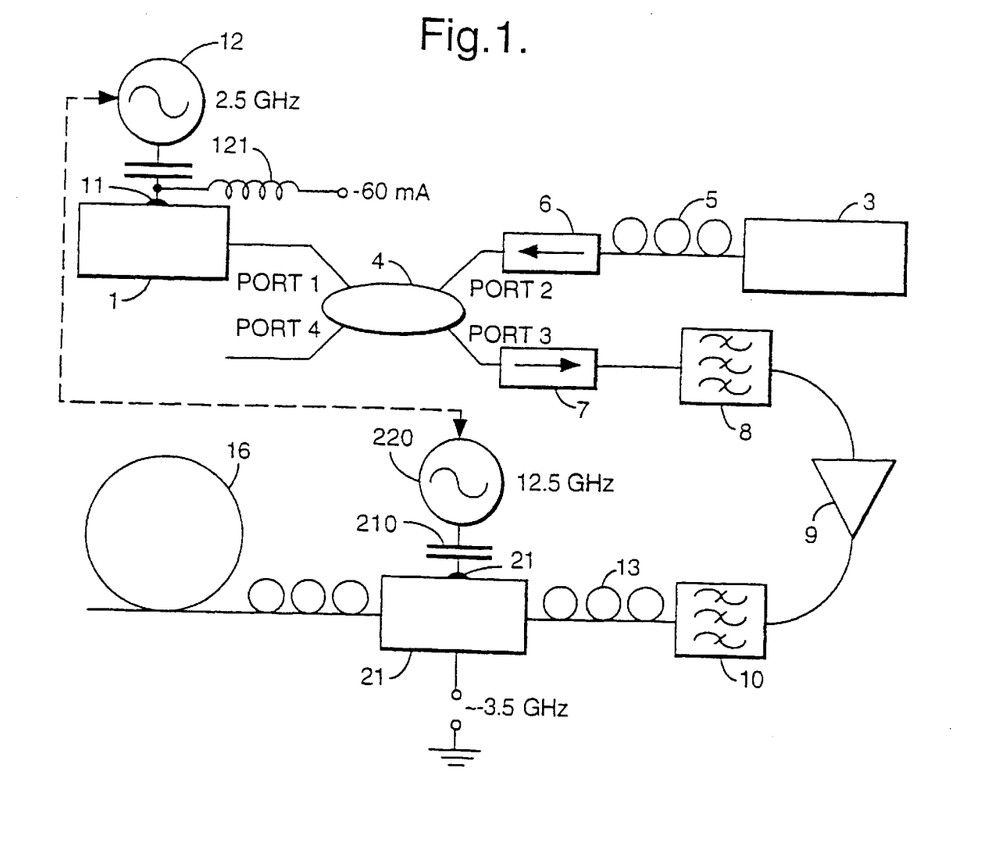
FIG. 1 is a schematic of an optical source embodying the present invention.

An optical pulse source comprises a gain-switched distributed feedback semiconductor laser diode (DFB-SLD) 1 and an electro-absorption modulator (EAM) 21 connected to the optical output of the DFB-SLD. Light from a cw source 3 is coupled into the optical cavity of the DFB-SLD via a 50:50 coupler 4. The DFB-SLD 1 and modulator 21 are driven via their respective gates 11, 20 by electrically phased-locked RF sources 12,220. The optical components are connected together by lengths of optical fibre 5, and polarisation controllers PC are associated with the fibre at the output of the cw source 3, and on either side of the EAM 21.

In this first example, the frequency of the RF drive for the SLD 1 is 2.5 GHz, while the frequency of the drive applied to the EAM is five times that at 12.5 GHz. It is the frequency of the RF drive to the SLD which determines the pulse repetition rate: a higher frequency is used for the EAM in order that the drive signal should be sufficiently sharp. The output of the SLD is typically around 30 ps full width half maximum (FWHM). To reduce the pedestal it is desirable to trim this to around 20 ps, and so the EAM requires a switching window of around this duration. A 2.5 GHz drive to the EAM would produce a switching window as great as 60 to 70 ps, so for this reason the higher frequency drive is used. The relative phase of the SLD drive and the EAM drive may be varied to centre the switching window on a given portion of the SLD output.

Figure 6:
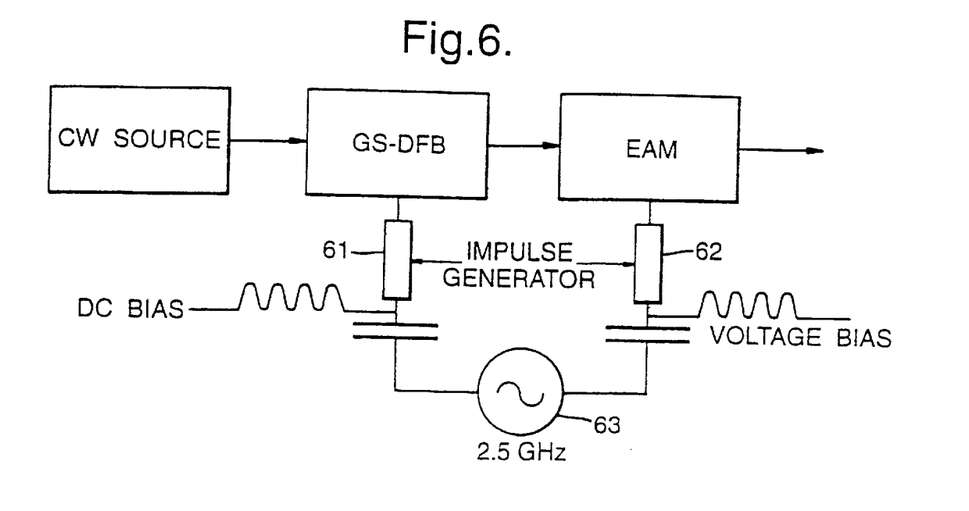
FIG. 6 is a schematic of a second embodiment.

In a second example shown in FIG. 6 a single RF source 63 at 2.5 GHz is used to drive both the SLD and the EAM. In this case the drive to both devices is shaped using pulse generators 61,62 such as the coaxial step recovery diode comb generator available commercially as ELISRA Series MW15900. This arrangement has the advantage of only requiring a single signal source, and avoids the possibility of the four out of five unused pulses from the high frequency source of the first example giving rise to unwanted sub-pulses in the optical output. This example further differs from the first example in that the cw source, SLD and EAM are arranged in line, with light from the cw source coupled directly into the SLD, rather than indirectly via a 4-port coupler as in the first example. This arrangement is particularly suitable for monolithic integrated construction, or for production using hybird integration and micro-opticai bench technology. Using this latter approach, the devices are formed as discrete components and subsequently mounted on a silicon micro-machined optical bench, as described in the paper by Collins J. V. et al., Electron. Lett, 31, (9) pp730–731.

Figure 9A:
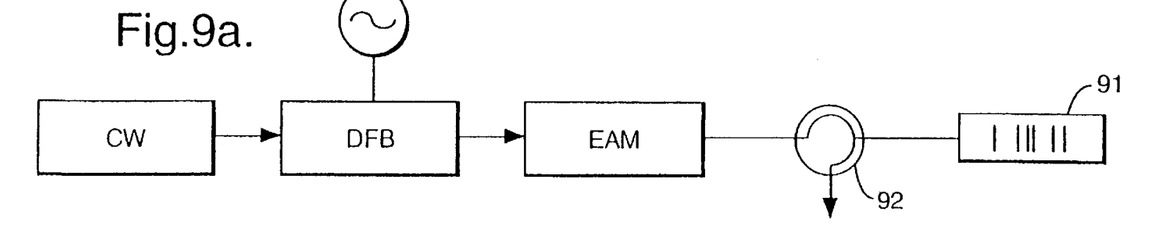
FIGS. 9a and 9b are schematics of further alternative embodiments using 3-port circulators.
Figure 9B:
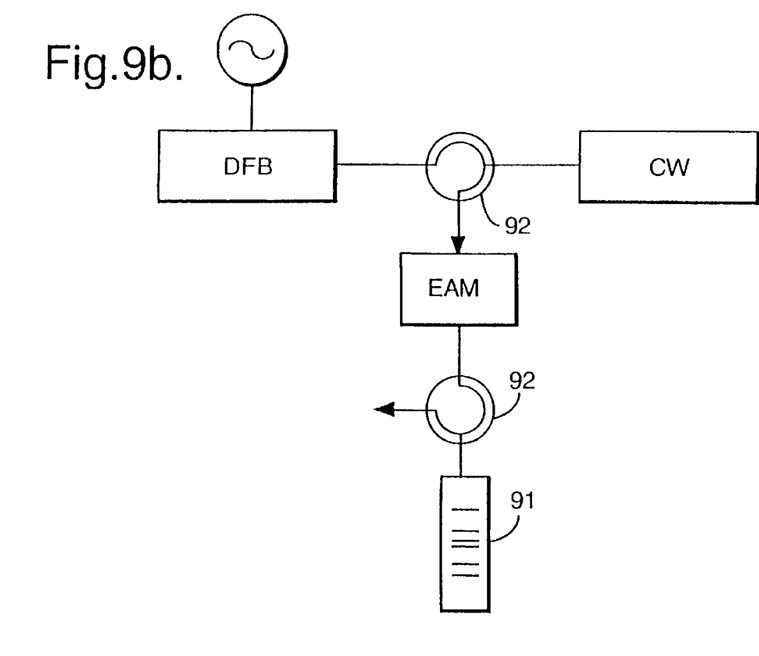

FIGS. 9a and 9b show further alternative systems embodying the invention. The topology of FIG. 9a corresponds generally to that of FIG. 6. The system differs in that it uses a fibre grating 91 coupled to the output of the EAM via an optical circulator 92. The grating functions to compress the pulse in the same manner as the dispersive fibre in the system of FIG. 1. The circulator is a 3-port device which has the advantage of significantly lower coupling losses by comparison with the 4-port coupler of FIG. 1. The system of FIG. 9b corresponds generally to that of FIG. 1, but again uses a circulator in place of the 4-port coupler, and a grating in place of normally dispersive fibre. A suitable circulator for use in these systems is that available from E-Tek, model no.PIFC210041000.

The structure and operation of the source will now be described in further detail, and the results obtained using the source discussed.

Figure 5:
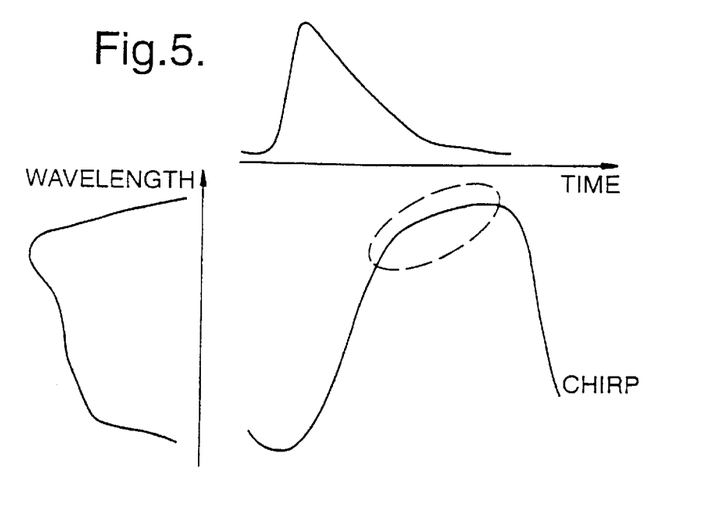
FIG. 5 is a graph showing the chirped output of the source of FIG. 1.

The 2.5 GHz electrical sine wave generated by the first RF source 12 is amplified and combined with an adjustable DC bias current via a bias-tee 121. This enables gain switching of the DFB-SLD 1. The DFB-SLD 1 is contained within a high-speed package. The DFB-SLD is a p side-up ridge-waveguide device with a centre wavelength of 1546.5 mm and threshold current of 39. mA at 15° C. The DFB temperature and DC bias current are maintained at 15° C. and 60 mA, respectively. The electrical signal to the DFB package has a peak-to-peak voltage of ~10 volts across a 50Ω load. The gain-switched optical pulse stream that results has a mean optical power of approximately −3 dBm and is injected into the top arm of a 50/50 coupler 4. This port is denoted port 1 in FIG. 1. The cw source 3 is a tunable HP 8168 external cavity optical source. This injects light through port 2 of the 50/50 coupler into the gain-switched DFB-SLD cavity. A set of polarisation controllers pc is used to alter the poiarisation state of the injected light before it passes through an optical isolator 6 and enters the cavity of the DFB-SLD. Port 4 of the 50/50 coupler is used to monitor the injected cw light. Gain-switched pulses exit port 3, pass through an optical isolator 7 and are filtered by a 1.1 nm bandpass filter 8 to remove spectral extremities and to reduce the non-linear chirp. The resulting signal is injected into an Erbium-doped Fibre Amplifier (EDFA). The output of the EDFA passes through a further filter 10 and polarisation controller 11. The chirp present in the signal is shown in FIG. 5, in which the ringed area corresponds to non-linear chirp. The EDFA boosted the power to the EAM to +4 dBm.

The EAM employs an InGaAsP/InGaAsP multiple quantum well absorber layer in a low capacitance buried ridge structure comprising a 0.8 μm wide active mesa encased in a 5 μm thick Fe-doped InP blocking structure. The modulator is 370 μm long and is fully packaged in a high speed connectorised fibre-pigtailed module. At 1550 nm the fibre-to-fibre insertion loss of the module was 7.3 dB, its modulation depth was 30.4 dB and it 3 dB electrical bandwidth was 14 GHz. The EAM is driven by a 12.5 GHz electrical sine wave generated by a separate frequency synthesiser 220 and amplified by a 26 GHz amplifier. The drive signal is applied via a contact 20. The EAM is further described in Moodie et al., Electron. Let, 94 vol 30(20) pp 1700–1701.

The two RF sources are frequency-locked and an adjustable electrical delay line 14 is used to allow temporal adjustment of the switching window of the EAM with respect to the gain-switched pulses. The pulses that emerge from the EAM pass through a further polarisation controller 15 and are shaped using a normally dispersive fibre 16 having a dispersion coefficient D=13 ps/nm. Interaction between the chirp, that is the frequency-spread of each pulse, and the dispersion in the fibre effects pulse compression.

Figure 2:
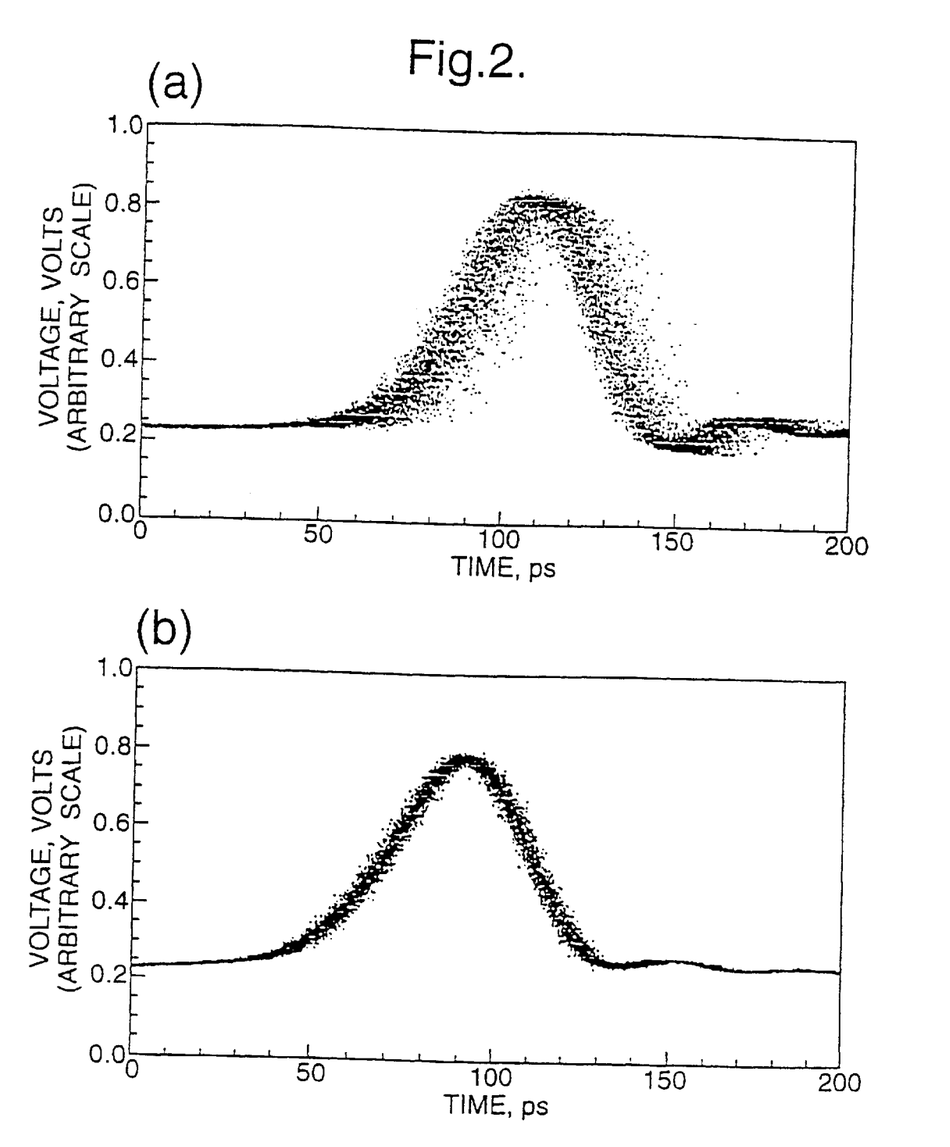
FIGS. 2a and 2b are oscilloscope traces showing the operation of the source with the cw light OFF and ON respectively.
Figure 3:
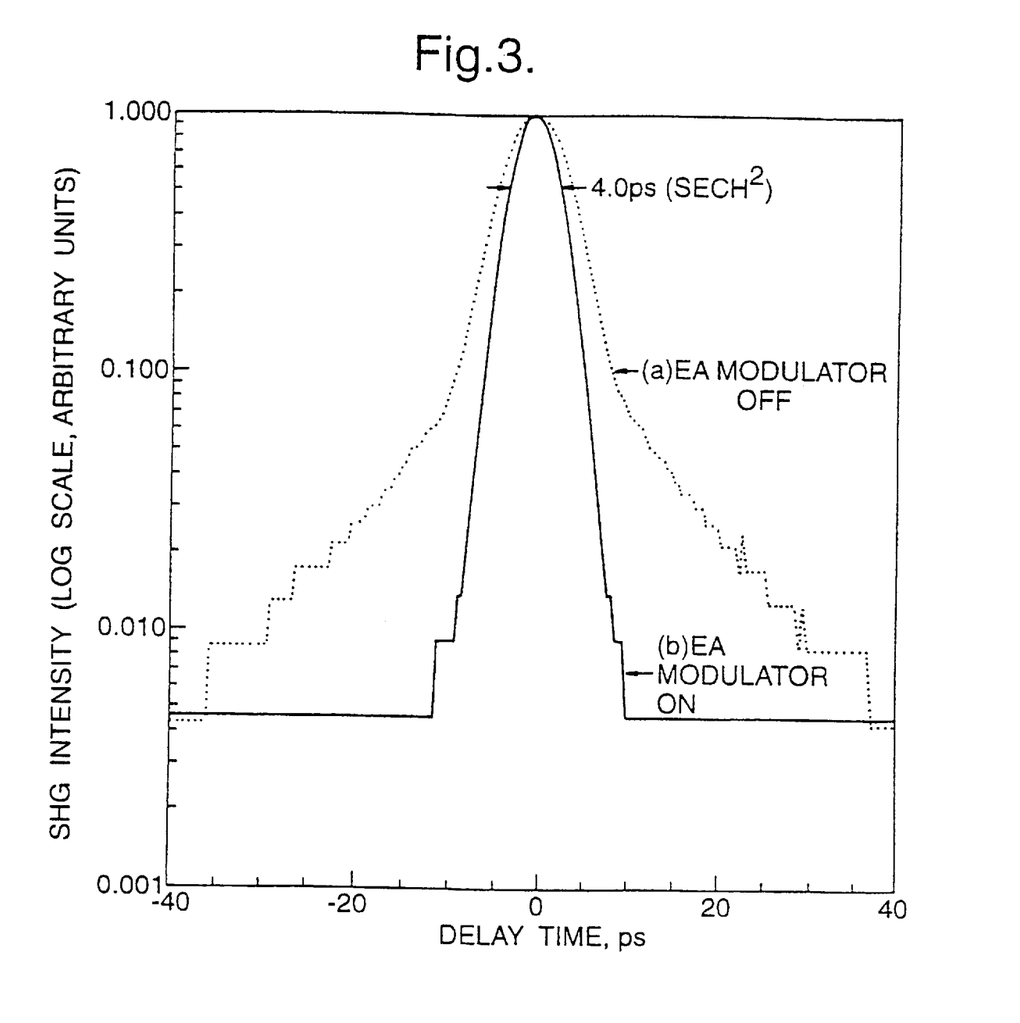
FIG. 3 is a plot of RF spectra for the source of FIG. 1.

FIG. 2 shows results obtained using the persistence facility of a high-speed sampling oscilloscope. FIG. 2(b) demonstrates the beneficial effect of cw light injection in suppressing the temporal jitter of the gain-switched optical pulses. In contrast, FIG. 2(a) was recorded without cw light injection and shows reduced pulse definition: this is indicative of timing jitter. FIG. 2 also shows that cw light injection advances the turn-on of the gain-switched pulses by ~15–20 ps. FIG. 3 reproduces the RF spectra obtained with: (a) cw light injection off, (b) cw light injection on (injected power was −8.4 dBm, wavelength 1547,6 nm,) and (c) background noise-floor (no optical power incident to RF spectrum analyser). For the source operating without cw light injection, a URTJ (Uncorrelated Root Mean Square Timing Jitter) of 3.6 ps was caiculated from the dataset used to generate FIGS. 3(a)&3(c). Similarly, an URTJ of 0.06 ps with cw light injection was calculated from the dataset used to generate FIGS. 3(b)&3(c). Comparison of these results with the criterion: $<\delta t^2>^{1/2}/T<0.06$, where $<\delta t^2>^{1/2}$ is the rms pulse jitter and T is the pulse separation [Wright & Carter, Appl. Phys. Lett., 1992, 60, (20), pp 2451–2453], shows that these low-jitter pulses are suitable for 100 Gbit/s systems.

Figure 4:
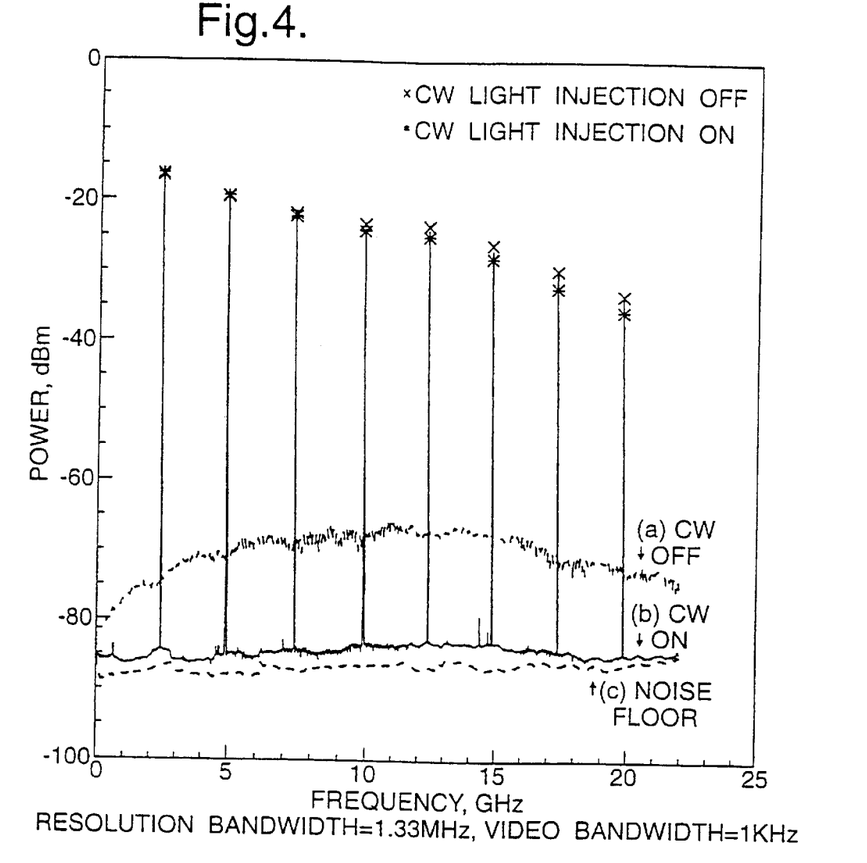
FIG. 4 is an autocorrelation plot for the source of FIG. 1.

The results show that, without the EAM, broadened pulses are produced and are accompanied by an increased pulse pedestal. The EAM driven at 12.5 GHz acts as a temporal filter and counters this undesirable effect. The autocorrelations displayed in FIG. 4 indicate the pedestal suppression obtained. The pedestal-suppressed pulses have a temporal Full-width Half-maximum (FWHM) of 6.2 ps (4.0 ps sech$^2$) and a spectral FWHM of 1.1 nm after passage through the normally dispersive fibre, giving a time-bandwidth product ΔTΔv of 0.56.

Figure 7:
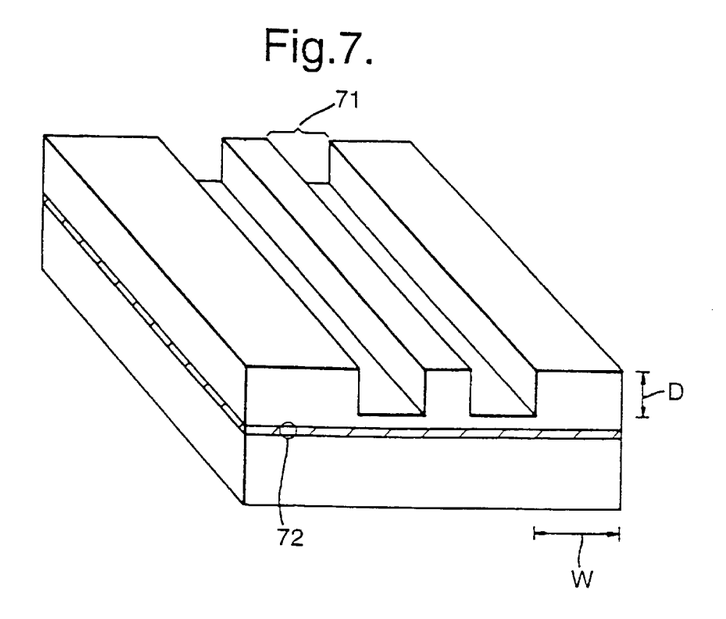
FIG. 7 is a diagram showing a ridge-waveguide SLD for use in the source of FIG. 1.
Figure 8:
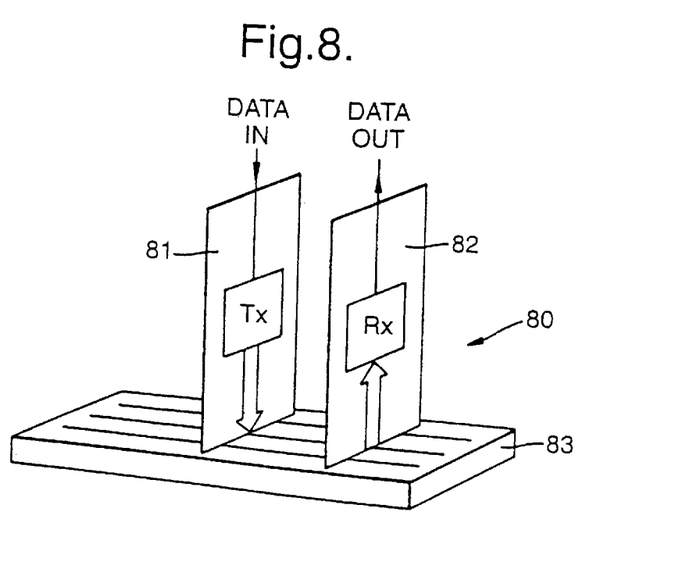
FIG. 8 is a perspective view of an optical backplane interconnect.

Table 1 below lists examples of appropriate components for implementing the circuit of FIG. 1. The ridge waveguide DFB-SLD has the structure shown in FIG. 7 and is described in Nelson et al., IEE Proc Pt. J, 132 (1),pp 12–19 and Westbrook et al. Electron. Lett, 20 (6), pp 225–226. FIG. 7 shows the etched trench 71 and the active region 72. The depth d of the trench is 1.5 microns and the width w is 3 microns. An alternative DFB-SLD structure such as a buried heterostructure might be used. The buried heterostructure has an intrinsically lower DC bias requirement, so that, in combination with the reduced bias required as a result of cw injection, the laser may operate with zero bias. The pulse source would then be particularly well suited for use in the laser array of an optical interconnect such as that shown in FIG. 8. In this example the interconnect uses an optical backplane 83 of the type disclosed in the above-cited Hamanaka patent. For clarity just two cards are shown mounted to the backplane. One card 81 includes a transmitter including an array of pulse sources each formed as described above. Light from these sources is transmitted via the bus 83 to a receiver on another card. At the receiver, the light from the pulse source array is received at an array of detectors. Such an interconnect might be used, for example, in a network switch of an optical telecommunications system, or in a computer system.

As noted in the introduction above, the invention may be implemented using a variety of other semiconductor laser diode types. The use of a Fabry Perot Laser potentially offers reduced fabrication costs, together with the possibility of tuning the source over a number of discrete wavelengths. A suitable FPL using a multiple quantum well (MQW) structure is disclosed in Lealman et al. Electron Lett, 27, (13), pp1191–1193.

Although in order to demonstrate the circuit of FIG. 1 a stand-alone external cavity. laser was used as the cw source, desirably an integrated semiconductor source would be used. For example, a further DFB-SLD might be used as the cw source.

Figure 10:
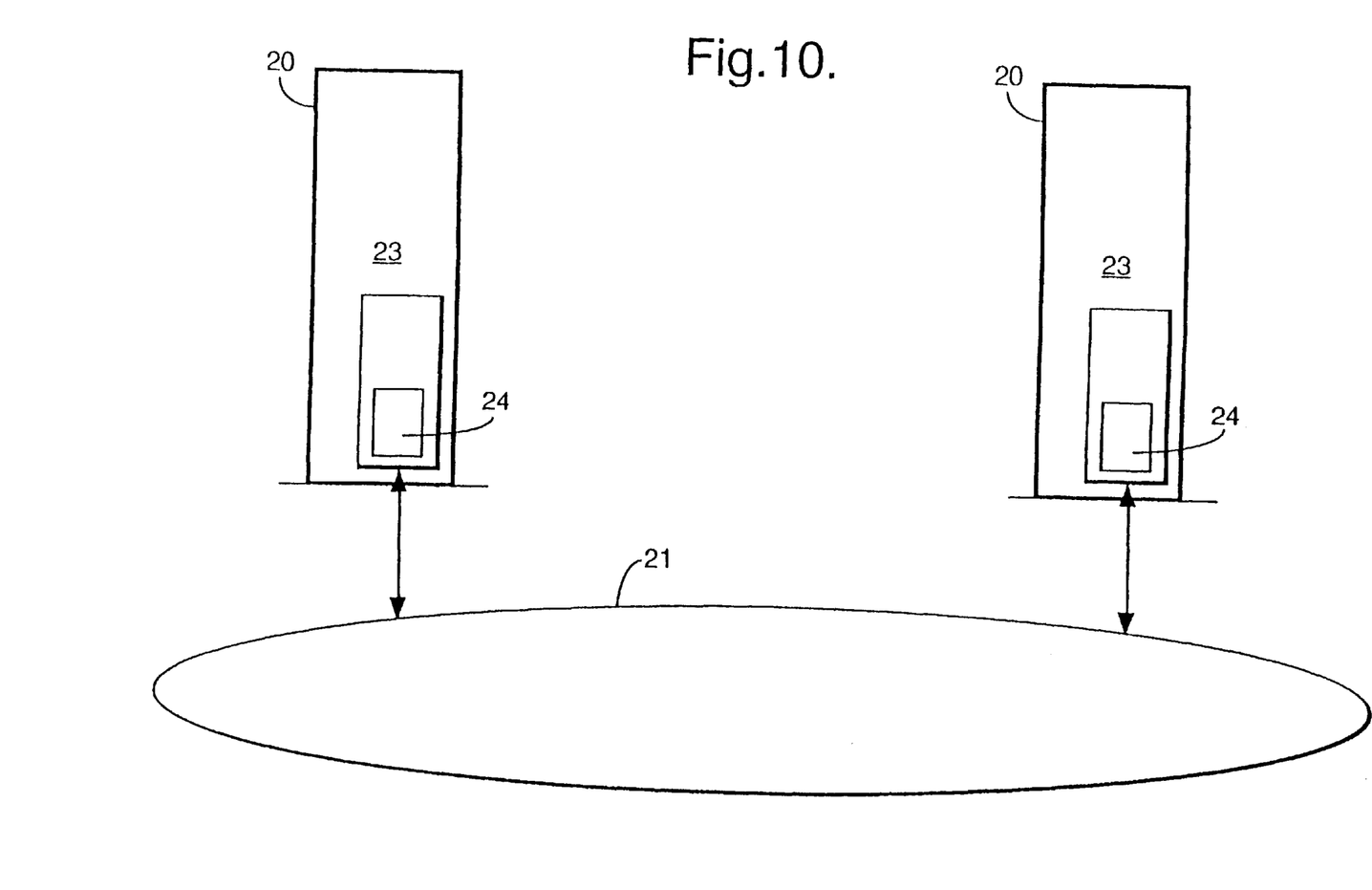
FIG. 10 is a schematic of a computer communications network.

In addition to the fields of use already instanced above, a source embodying the present invention might be used, for example, in the network interface of a workstation connected to an optical fibre LAN or in a broadband interface for a multiprocessor computer system. Alternatively, it might be used in conjunction with the industry standard HIPPI parallel interface. This interface architecture is based on 32/64 bit paths and is intended for use, for example, in providing a high bit-rate connection between a computer and peripherals such as an RAID mass storage device. A source embodying the present invention might be used in converting the parallel data stream from such an interface into a high bit rate serial OTDM data stream for communication via a broadband optical network. FIG. 10 shows schematically a computer communications network in which a number of computer systems 20 are interconnected via a fibre optic network 21. Each of the computer systems includes a respective network interface card 23. The interface card modulates electrical data from the computer system onto an optical signal which is generated by an optical pulse source 24. The source may for example have the configuration shown in FIG. 9a.

Figure 11:
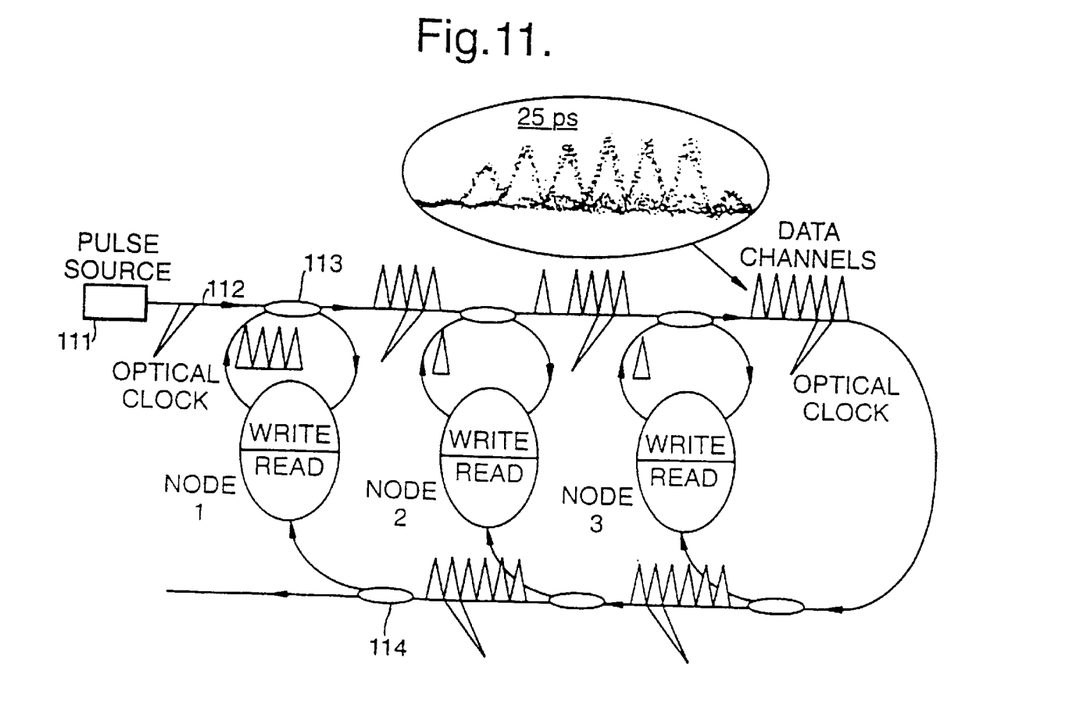
FIG. 11 is a schematic of a further alternative network.

FIG. 11 shows another example of a network embodying the present invention. This uses an optical bus 112 having a re-entrant topology, as described and claimed in our copending European Patent Application no. 96304694.1, filed Jun. 26, 1996. In this network, the pulse source 111, which may have a configuration, for example, as shown in FIG. 1 or in FIGS. 9a, 9b, is connected to the head of the network. It sends an optical clock signal downstream. Each of a series of nodes includes a first coupler 113 which couples the optical clock signal from one of two co-located optical waveguides in the bus to the node transmitter stage. Alternatively, a single waveguide may be used with the clock and data pulses distinguishable by orthogonal polarisation states. This stage modulates the clock signal and returns the modulated signal onto the other of the two waveguides, in a selected time slot in an OTDMA (optical time division multiple access) frame. Each node reads data from a second coupler connected to the said other of the two waveguides in a downstream location. The enlarged detail shows the OTDMA multiplex which is formed in this manner. In this example the multiplex has a pulse separation of 25 picoseconds.

TABLE 1

| LABEL | EXPERIMENTAL COMPONENT | MANUFACTURER, MODEL |
|---|---|---|
| 1 | Gain-switched DFB | in-house BT Labs, chip number 1258 |
| 3 | CW optical source | Hewlett-Packard, JP8l68A |
| 4 | 50/50 coupler | Sifam, model P22515AA50 |
| PC | Polarisation Controllers | in-house, BT Labs |
| 6, 7 | Optical Isolators (×2) | Isowave, model 115PIPTX |
| 8 | Optical Filter (b/w 1.3 nm) | JDS Fitel, model TBl500B |
| 9 | Er:doped fibre amp. | in-house, BT Labs |
| 10 | Optical Filter (b/w 2.4 nm) | JDS Fitel, tunable bandpass filter 1.48–155 μm |
| 12 | 2.5 GHz Electrical Synth | Hewlett-Packard, JP83620A |
| 13 | EA modulator | in-house BT Labs, s/n AT2036D447 |
| 14 | Variable Phase delay (elec.) | ARRA, model 3428A |
| 220 | 12.5 GHz Electrical Synth. | Hewlett-Packard, HP83623A |
| 121 | Bias-tee | Picosecond Pulse Labs, model 5575-A |
|  | ~60 mA current source | ILX lightwave, model LBX 3207 |
| 16 | Normally dispersive fibre | in-house BT Labs, Run ref: PRSHG26.03 |
| 220 | Bias-tees (×2) | Wilton, K250 |

The labels shown in the above table are related to the experimental configuration in FIG.1.

What is claimed is:

1. An optical pulse source comprising:
 a) a gain-switched semiconductor laser diode;
 b) a continuous wave light source which is coupled to the optical cavity of the semiconductor laser diode;
 c) an electro-optic amplitude modulator which is connected to the optical output of the semiconductor laser diode; and
 d) control inputs, located respectively on the semiconductor laser diode and on the electro-optic modulator, for applying synchronized modulating signals to the semiconductor laser diode and to the modulator.

2. An optical pulse source according to claim 1, in which the electro-optic amplitude modulator is an electro-absorption modulator.

3. An optical pulse source according to claim 1, in which the semiconductor laser diode is a distributed feedback semiconductor laser diode.

4. An optical pulse source according to claim 1, in which the semiconductor laser diode is a Fabry Perot laser.

5. An optical pulse source according to claim 1, further comprising an optical pulse shaper which is connected to the optical output of the modulator.

6. An optical pulse source according to claim 1, further comprising:
 e) a radio frequency signal source; and
 f) at least one pulse generator which is connected between the radio frequency signal source and a respective one of the semiconductor laser diode and the electro-optic amplitude modulator.

7. An optical interconnect including an optical pulse source according to claim 1.

8. An optical pulse source according to claim 5, in which the optical pulse shaper is connected to the optical output of the modulator via an optical circulator.

9. An optical pulse source according to claim 5, in which the optical pulse shaper includes a chirped grating.

10. An optical pulse source according to claim 6 including two pulse generators and a single radio frequency signal source which is connected to both the semiconductor laser diode and the electro-optic amplitude modulator via respective pulse generators.

11. A method of generating optical pulses comprising:
 a) applying a first electrical modulating signal to a gate input of a gain-switched semiconductor laser diode;
 b) coupling continuous wave light into an optical cavity of the semiconductor laser diode;
 c) applying a second modulating signal which is synchronised to the first electrical modulating signal to a control input of an electro-optic amplitude modulator; and
 d) passing pulses output from the semiconductor laser diode through the electro-optic amplitude modulator;
 wherein step (a) includes passing the first electrical modulating signal through a pulse generator before applying the said signal to the said gate input.

12. A method of generating optical pulses comprising:
 a) applying a first electrical modulating signal to a gate input of a gain-switched semiconductor laser diode;
 b) coupling continuous wave light into an optical cavity of the semiconductor laser diode;
 c) applying a second modulating signal which is synchronised to the first electrical modulating signal to a control input of an electro-optic amplitude modulator; and
 d) passing pulses output from the semiconductor laser diode through the electro-optic amplitude modulator;
 wherein step (b) includes passing the second modulating signal through a pulse generator before applying the said signal to the control input.

13. A method according to claim 12 in which step (a) includes passing the first electrical modulating signal through a pulse generator before applying said signal to said gate input and in which both the first and second modulating signals are derived from a single radio frequency source.

14. A method of generating optical pulses comprising:
 a) applying a first electrical modulating signal to a gate input of a gain-switched semiconductor laser diode;
 b) coupling continuous wave light into an optical cavity of the semiconductor laser diode;
 c) applying a second modulating signal which is synchronised to the first electrical modulating signal to a control input of an electro-optic amplitude modulator; and
 d) passing pulses output from the semiconductor laser diode through the electro-optic amplitude modulator; and
 e) passing the output of the electro-optic modulator through an optical pulse shaper.

15. A method of operating an optical communications network including generating an optical pulse by a method comprising:
 a) applying a first electrical modulating signal to a gate input of a gain-switched semiconductor laser diode;
 b) coupling continuous wave light into an optical cavity of the semiconductor laser diode;
 c) applying a second modulating signal which is synchronised to the first electrical modulating signal to a control input of an electro-optic amplitude modulator; and
 d) passing pulses output from the semiconductor laser diode through the electro-optic amplitude modulator.

16. An optical pulse source comprising:

a) a semiconductor laser diode;

b) a continuous wave light source which is coupled to the optical cavity of the semiconductor laser diode;

c) an optical amplitude modulator which is connected to the optical output of the semiconductor laser diode;

d) means for applying synchronised modulating signals to the semiconductor laser diode and to the optical amplitude modulator.

17. An optical communications network including an optical pulse source comprising:

a) a gain-switched semiconductor laser diode;

b) a continuous wave light source which is coupled to the optical cavity of the semiconductor laser diode;

c) an electro-optic amplitude modulator which is connected to the optical output of the semiconductor laser diode; and d) control inputs, located respectively on the semiconductor laser diode and on the electro-optic modulator, for applying synchronised modulating signals to the semiconductor laser diode and to the modulator.

* * * * *